(12) United States Patent
Bai

(10) Patent No.: US 10,934,613 B2
(45) Date of Patent: Mar. 2, 2021

(54) MASK PLATE, MASK PLATE ASSEMBLY INCLUDING MASK PLATE AND METHOD FOR MANUFACTURING SAME

(71) Applicants: BOE TECHNOLOGY GROUP CO., LTD., Beijing (CN); ORDOS YUANSHENG OPTOELECTRONICS CO., LTD., Inner Mongolia (CN)

(72) Inventor: Shanshan Bai, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 0 days.

(21) Appl. No.: 15/579,855

(22) PCT Filed: Jun. 16, 2017

(86) PCT No.: PCT/CN2017/088564
§ 371 (c)(1),
(2) Date: Dec. 5, 2017

(87) PCT Pub. No.: WO2018/024040
PCT Pub. Date: Feb. 8, 2018

(65) Prior Publication Data
US 2019/0144986 A1    May 16, 2019

(30) Foreign Application Priority Data

Aug. 3, 2016   (CN) .......................... 201610627080.2

(51) Int. Cl.
*C23C 14/04* (2006.01)
*B21D 11/02* (2006.01)
(Continued)

(52) U.S. Cl.
CPC ............ *C23C 14/042* (2013.01); *B21D 11/02* (2013.01); *C23C 14/24* (2013.01); *H01L 51/00* (2013.01)

(58) Field of Classification Search
None
See application file for complete search history.

(56) References Cited

U.S. PATENT DOCUMENTS

2006/0148368 A1* 7/2006 Kang .................... C23C 14/042
                                                          445/47
2015/0050767 A1* 2/2015 Kuriyama ............... H01L 51/56
                                                           438/34
(Continued)

FOREIGN PATENT DOCUMENTS

CN    202576542 U    12/2012
CN    103388121 A    11/2013
(Continued)

OTHER PUBLICATIONS

International Search Report and Written Opinion for Application No. PCT/CN2017/088564, dated Aug. 22, 2017, 12 Pages.
(Continued)

*Primary Examiner* — Karla A Moore
*Assistant Examiner* — Tiffany Z Nuckols
(74) *Attorney, Agent, or Firm* — Brooks Kushman P.C.

(57) ABSTRACT

A mask plate, a mask plate assembly including the mask plate, a method for manufacturing the mask plate and a method for manufacturing the mask plate assembly are provided according to the present disclosure. The mask plate is used in evaporating to the display substrate, and includes a plurality of grooves arranged in an array form and on a surface of the mask plate. An opening is arranged in the middle of each of the grooves, and the opening corresponds to a display region of a display substrate.

16 Claims, 4 Drawing Sheets

(51) Int. Cl.
*C23C 14/24* (2006.01)
*H01L 51/00* (2006.01)

(56) References Cited

U.S. PATENT DOCUMENTS

| | | | |
|---|---|---|---|
| 2015/0101536 A1* | 4/2015 | Han | C23C 14/042 118/721 |
| 2015/0165464 A1* | 6/2015 | Baek | H01L 51/0011 118/504 |
| 2016/0296966 A1* | 10/2016 | Hong | B05B 12/20 |

FOREIGN PATENT DOCUMENTS

| | | |
|---|---|---|
| CN | 103556111 A | 2/2014 |
| CN | 103898441 A | 7/2014 |
| CN | 204125521 U | 1/2015 |
| CN | 105154822 A | 12/2015 |
| CN | 106119773 A | 11/2016 |
| JP | 2006052438 A | 2/2006 |
| JP | 2006227432 A | 8/2006 |

OTHER PUBLICATIONS

First Chinese Office Action for Application No. 201610627080.2, dated Mar. 20, 2018, 6 Pages.

* cited by examiner

MASK PLATE, MASK PLATE ASSEMBLY INCLUDING MASK PLATE AND METHOD FOR MANUFACTURING SAME

CROSS-REFERENCE TO RELATED DISCLOSURE APPLICATIONS

This application is the U.S. national phase of PCT Application No. PCT/CN2017/088564 filed on Jun. 16, 2017, which claims priority to Chinese Patent Application No. 201610627080.2 filed on Aug. 3, 2016, which are incorporated herein by reference in their entireties.

TECHNICAL FIELD

The present disclosure relates to the field of display technology, and in particular to a mask plate, a mask plate assembly including the mask plate, a method for manufacturing the mask plate and a method for manufacturing the mask plate assembly.

BACKGROUND

Mask plates used in vacuum evaporation are crucial components in organic light emission diode (OLED) manufacturing technology. The quality of the mask plate directly affects the manufacturing cost and product quality. Fine metal mask (FMM) is one of the key equipment among the mask plates used in the OLED evaporation process. FMM is used to evaporate light-emitting layer material and form a pixel pattern on a back plate. Therefore, the quality of FMM is directly related to the display effect of a screen.

With the rapid development of active-matrix organic light emitting diode (AMOLED) displays, AMOLED has been applied to various fields in people's lives. In particular, a demand of AMOLED in the field of smart wearable devices has rapidly increased recently, and the shape of a display screen is not limited to a conventional square shape, but extended to a shape with a design sense, for example, a circular shape. Such an AMOLED product, for example, a circular AMOLED product, has a relatively high requirement on the mask plate used in the evaporation, because the deformation and wrinkle tend to occur if strains inside a circular FMM are not uniform when being stretched, and thus resulting in a poor masking performance.

SUMMARY

An object of the present disclosure is to provide a mask plate, a mask plate assembly including the mask plate, a method for manufacturing the mask plate and a method for manufacturing the mask plate assembly.

The technical solutions of the present disclosure are described as follows.

In a first aspect, the present disclosure provides a mask plate that may be used in evaporation to a display substrate. The mask plate includes a plurality of grooves arranged in an array form and on a surface of the mask plate, where an opening is arranged in the middle of each of the grooves, and the opening corresponds to a display region of a display substrate.

Optionally, the groove is of a rectangular shape.
Optionally, the groove is of a square shape.
Optionally, the opening is of an oval shape.
Optionally, the opening is of a circular shape, and a diameter of the opening is 100 to 300 microns larger than a diameter of the corresponding display region on the display substrate.

Optionally, a protrusion is formed around an outer peripheral edge of the opening portion.

Optionally, the protrusion has a width ranging from 1 millimeter to 1.5 millimeters.

Optionally, a depth of the groove is one-half of a thickness of the mask plate.

Optionally, the mask plate further includes an alignment portion corresponding to each of the grooves.

Optionally, the alignment portion includes an alignment hole arranged at each of four corners of each of the grooves.

Optionally, a distance between two adjacent grooves is 1 to 2 millimeters.

In a second aspect, the present disclosure provides a mask plate assembly used in evaporation. The mask plate assembly includes a first mask plate and a second mask plate stacked on the first mask plate, where the first mask plate is the mask plate as described above, and the surface of the first mask plate arranged with the plurality of grooves faces the second mask plate.

Optionally, the mask plate assembly further includes a frame. The first mask plate is welded onto the frame, and the second mask plate is welded onto the first mask plate.

In the third aspect, the present disclosure provides a method for manufacturing the above mask plate. The method includes: forming a plurality of grooves in an array form and on a surface of the mask plate; and forming an opening in the middle of each of the grooves, where the opening corresponds to a display region of a display substrate.

Optionally, the forming the plurality of grooves in an array form and on the surface of the mask plate includes forming the plurality of grooves through a half-etching process.

In the fourth aspect, the present disclosure provides a method for manufacturing the above mask plate assembly. The method includes: stretching four sides of the first mask plate simultaneously by a stretching machine, and welding the four sides of the first mask plate onto four sides of the frame; and stretching and welding, after the first mask plate is stretched and welded, the second mask plate onto the first mask plate in such a manner that the second mask plate is attached to the surface of the first mask plate arranged with the plurality of grooves and stacked on the first mask plate.

Optionally, the method further includes: controlling a sagging amount of the first mask plate to be less than 150 microns, in the case of stretching four sides of the first mask plate simultaneously by the stretching machine and welding the four sides of the first mask plate onto four sides of the frame.

BRIEF DESCRIPTION OF THE DRAWINGS

In order to illustrate the technical solutions of the present disclosure more clearly, the drawings used in the embodiment descriptions will be described hereinafter briefly. Obviously, the following drawings merely relate to some embodiments of the present disclosure, and based on these drawings, a person skilled in the art may obtain the other drawings without any creative effort.

DETAILED DESCRIPTION

To illustrate the object, technical solutions and advantages of embodiments of the present disclosure more clearly, hereinafter the technical solutions of the embodiments of the present disclosure will be described clearly and completely in conjunction with drawings. Obviously, the described embodiments are merely part rather than all of the embodiments of the present disclosure. All other embodiments obtained by persons skilled in the art based on the embodiments of the present disclosure without creative efforts shall fall within the protection scope of the present disclosure.

In the related art, a fine metal mask FMM is used in evaporating to a display substrate. The fine metal mask FMM has a pattern portion, a shape of which is the same as that of a display region of the display substrate. The pattern portion is provided with an opening corresponding to the display region. In a case that the display regions of the display substrate are of a special shape such as a circular shape, the non-uniform stress and wrinkle tend to occur when stretching the fine metal mask FMM, as the pattern portion has a special shape such as the circular shape, and thus resulting in a poor masking performance. In view of the above, the present disclosure provides a mask plate, to prevent the non-uniform strain and wrinkle from occurring in the process of stretching the fine metal mask FMM of the display region of the display substrate with a special shape such as a circular shape, which enables the design of the fine metal mask FMM unaffected by a shape and a size of the display region of the display substrate.

Figure 1:
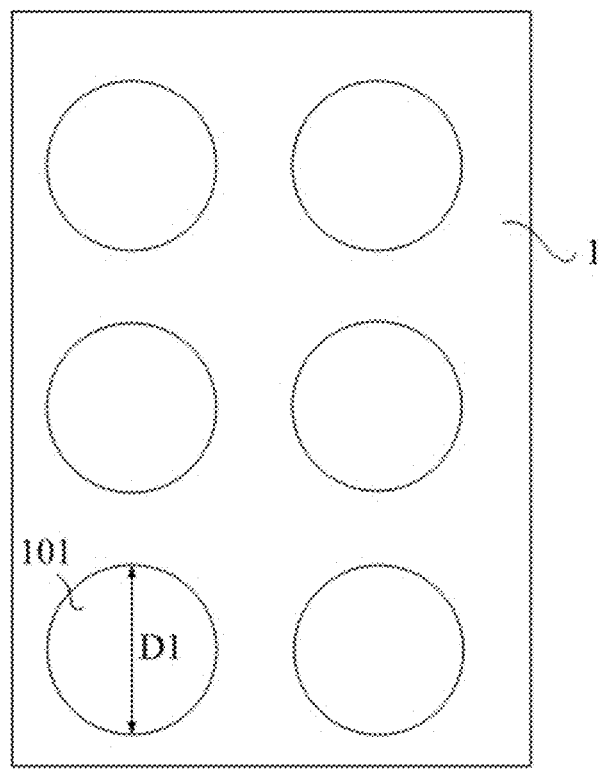
FIG. 1 is a schematic diagram of a display region of a display substrate according to an embodiment of the present disclosure.

FIG. 1 is a schematic diagram of a display region of a display substrate according to an embodiment of the present disclosure. As shown in FIG. 1, each of the display regions 101 is circular. It can be understood that, in practical applications, the display region 101 may be of other shapes, such as an oval shape.

Figure 2:
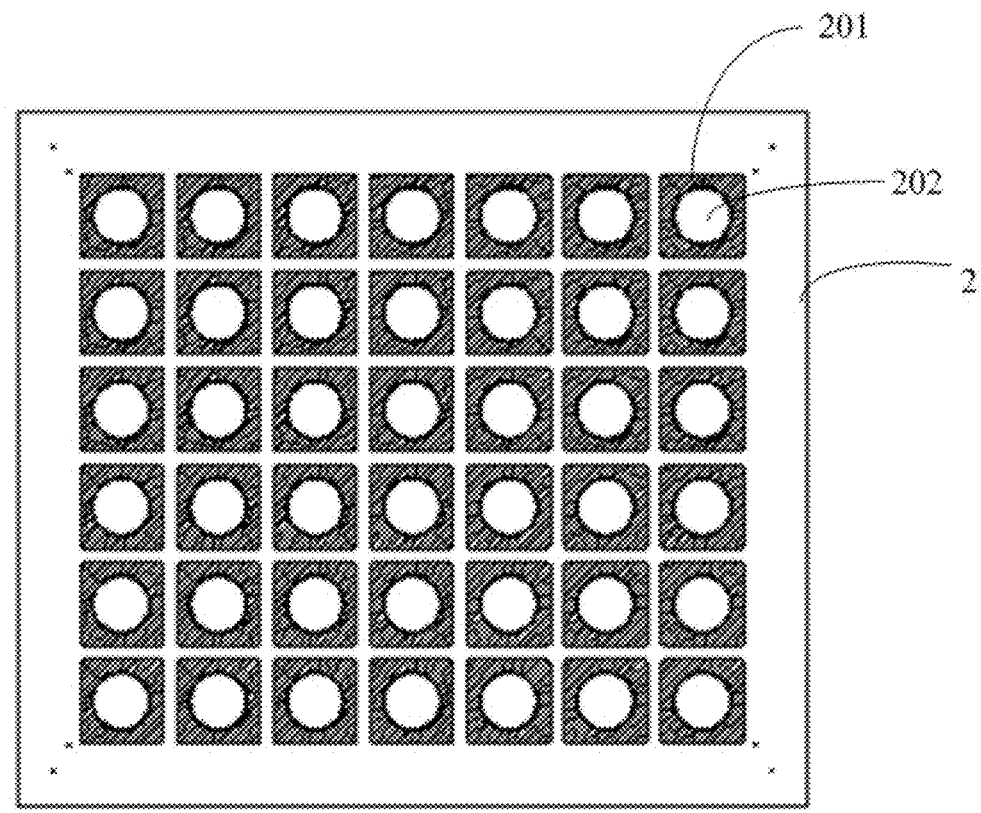
FIG. 2 is a schematic diagram of a mask plate according to an embodiment of the present disclosure.
Figure 3A:
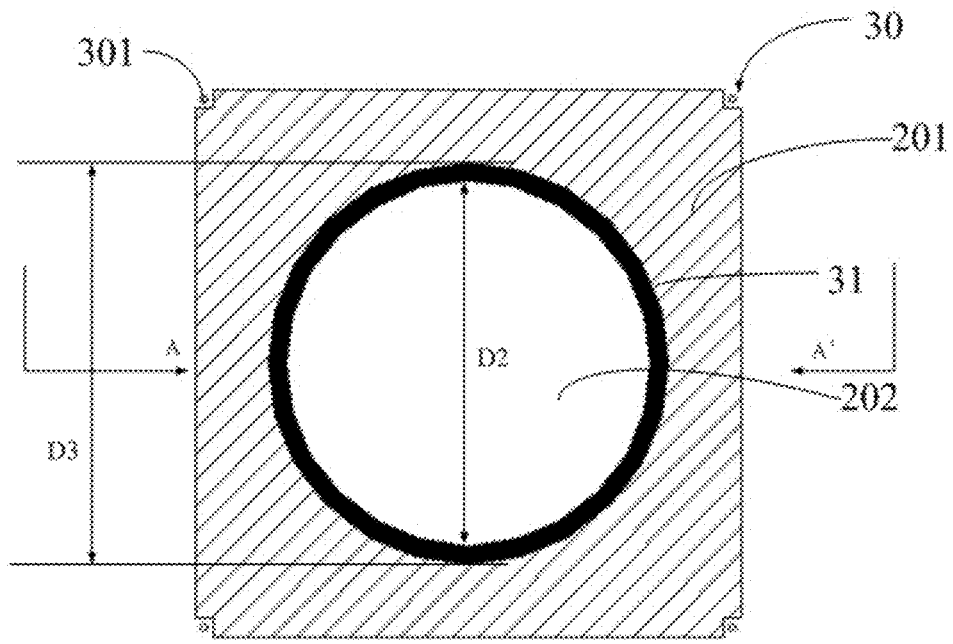
FIG. 3A is a schematic diagram of a groove of a mask plate according to an embodiment of the present disclosure.
Figure 3B:
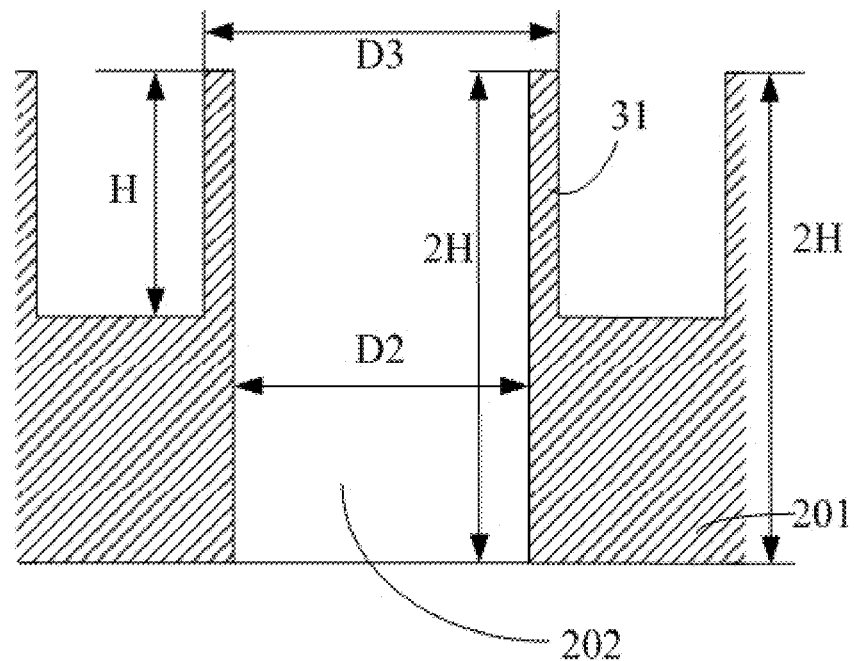
FIG. 3B is a sectional view along line A-A' in FIG. 3A.

The mask plate according to the embodiment of the present disclosure may be used when evaporating to a display substrate 1. As shown in FIGS. 2, 3A and 3B, a mask plate 2 includes a plurality of grooves 201 arranged in an array form and on a surface of the mask plate 2. An opening 202 is arranged in the middle of each of the grooves 201, and each opening 202 corresponds to one of the display regions 101 of the display substrate 1.

In the present disclosure, when evaporating to the display substrate 1, two mask plates may be arranged, one is a fine metal mask FMM arranged with a pixel opening pattern thereon for evaporate organic material, and the other is the mask plate 2 according to the embodiment of the present disclosure, which is used as an auxiliary mask plate and stacked below the fine metal mask FMM. The surface of the mask plate 2 according to the embodiment of the present disclosure arranged with the grooves 201 faces the fine metal mask FMM, and the mask plate 2 is mainly configured to block the organic material, support the fine metal mask FMM and define a shape of the display region 101. The groove 201 arranged on the auxiliary mask plate 2 is a thinned region, a thickness of which is smaller than a thickness of the mask plate 2. A plurality of openings 202 corresponding to the display regions each having a special shape such as a circular shape of the display substrate 1 are arranged in the thinned region with the grooves 201, and the shape of the opening 202 may be circular. Since the grooves 201 have a regular shape (such as a rectangular shape), the non-uniform stress and wrinkle do not occur to the openings 202 with a special shape such as the circular shape when stretching the fine metal mask FMM. The mask plate 2 is stretched as a whole. Except a region corresponding to each of the display regions 101 arranged with the opening, the other regions may completely block the organic material and define the shape of each display region 101, which enables the design of the fine metal mask FMM unaffected by the shape and size of each display region 101 of the display substrate 1. In addition, a weight of the auxiliary mask plate 2 may be decreased due to the thinned region with the grooves 201 to decrease gravity sagging phenomena, so that a sagging amount of the mask plate 2 is easily controlled within 150 microns, and a stretching tension and a deformation amount of the opening 202 may be decreased.

It should be noted that the mask plate 2 according to the present disclosure may be used as an evaporation mask plate in an evaporation process, and may be used as a photolithography mask plate in other processes (such as a photolithography process).

It should also be noted that the mask plate 2 according to the present disclosure may be used together with the fine metal mask FMM. In practical applications, the mask plate 2 may also be used individually when it is required to evaporate to form a special shape such as a circular shape on the display substrate.

In addition, it should also be noted that the groove 201 may be formed through a half-etching process.

In the embodiment according to the present disclosure, as shown in FIGS. 2, 3A and 3B, the groove 201 is of a rectangular shape. Alternatively, the groove 201 may be of a square shape. If the shape of the groove 201 is a rectangular, especially a square, it is conducive to enable the stress uniform under stretching, and it is hard for deformation and wrinkles to occur. It can be understood that the shape of the groove may not be limited thereto.

In the embodiment according to the present disclosure, as shown in FIGS. 2, 3A and 3B, the shape of the opening 202 is circular. However, the present disclosure is not limited thereto, and the shape of the opening 202 may also be other shapes such as an oval. With the opening 202 with the above shapes, the mask plate 2 according to the present disclosure may be used to evaporate to the display substrate 1, the display region 101 of which is of a circular shape or an oval shape.

In addition, as shown in FIGS. 2, 3A and 3B, in a case that the display region 101 is of a circular shape, a diameter of each display region 101 of the display substrate 1 is D1, and a diameter D2 of the opening 202 of the mask plate 2 according to the embodiment of the present disclosure should be slightly larger than the diameter D1 of each display region 101 of the display substrate 1. Optionally, the value of D2 may be 100 to 300 microns larger than the value of D1, which ensures the opening 202 to have a sufficient range so that each display region 101 of the display substrate 1 may be completely evaporated the organic material to. It can be understood that, in practical applications, the diameter D2 of the opening 202 of the mask plate 2 may be determined according to practical situations and the fabrication precision of the mask plate 2.

FIG. 3A is a schematic diagram of a groove of a mask plate according to an embodiment of the present disclosure, and FIG. 3B is a sectional view along line A-A' in FIG. 3A. In the embodiment of the present disclosure, as shown in FIGS. 3A and 3B, a protrusion 31 is formed around an outer peripheral edge of the opening 202. Due to the protrusion 31 arranged around the outer peripheral edge of the opening 202, an edge of the opening 202 is thick, which may further ensure the mask plate 2 not to wrinkle under stretching. In addition, when the mask plate 2 and the fine metal mask FMM are used together to evaporate to the display substrate 1, due to the protrusion 31, a stretching machine stretches four sides of the mask plate 2 simultaneously and welds the four sides of the mask plate 2 to four sides of a frame. After the mask plate 2 is stretched and welded, the fine metal mask FMM is stretched onto the stretched mask plate 2 in such a manner that the fine metal mask FMM is attached to the surface of the mask plate 2 arranged with the grooves 201 and stacked on the mask plate 2. The protrusion 31 around the opening 202 of the mask plate 2 is closely attached to the fine metal mask FMM. In such a manner, contaminant particles may be prevented from entering an interlayer between the fine metal mask FMM and the mask plate 2, and there is a space between the half-etched groove 201 around the opening 202 and the fine metal mask FMM, which enables the contaminant particles fall within a region of the half-etched groove 201 without contaminating a surface of the fine metal mask FMM, and thus reducing disadvantages of the contaminant particles.

Optionally, the protrusion 31 has a width ranging from 1 to 1.5 millimeters. Optionally, the protrusion 31 may be made of metal.

In the above embodiment, the circular opening 202 is taken as an example, and a region of the mask plate 2 other than the opening 202 with the diameter D3 (that is, the region other than the protrusion 31) is half-etched. Optionally, D3 is 2 to 3 millimeters larger than D2.

Optionally, in the embodiment according to the present disclosure, a distance between two adjacent grooves 201 is 1 to 2 millimeters. Optionally, a depth of the groove 201 is one-half of a thickness of the mask plate 2. In such a solution, the stress of the mask plate 2 under stretching may be ensured to be uniform, and the groove 201 is lightened but not too thin to cause other undesirable phenomena.

It can be understood that, in practical applications, the distance between the adjacent grooves 201 and the depth of the groove 201 are not limited and can be adjusted according to actual requirements.

Optionally, in the embodiment according to the present disclosure, as shown in FIG. 3, the mask plate 2 further includes an alignment portion 30 corresponding to each of the grooves 201. The alignment portion 30 includes an alignment hole 301 arranged at each of four corners of each of the grooves 201.

The alignment hole 301 is arranged at each of the four corners of each rectangle groove 201 of the mask plate 2 to align the mask plate 2 to a mother glass and FMM in stretching, which ensures the alignment accuracy of each display region 101 of the display substrate 1. It can be understood that, in practical applications, the alignment portion 30 is not limited to the alignment hole, but may be provided in other ways.

Figure 5:
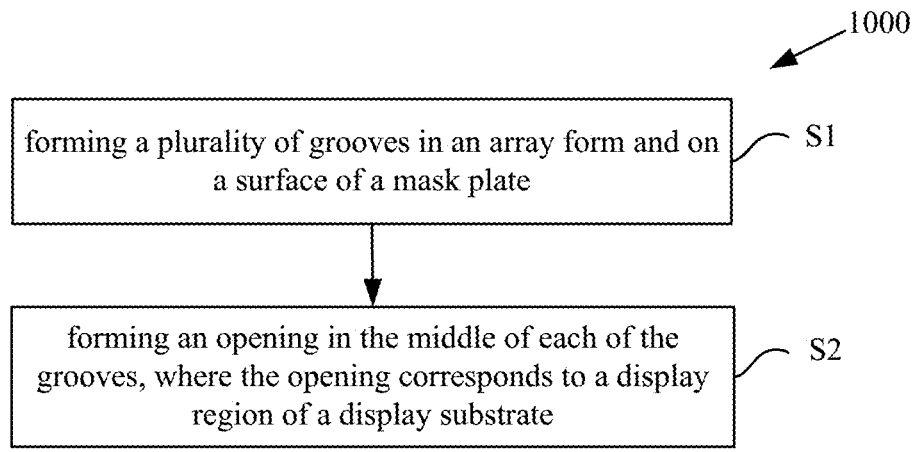
FIG. 5 is a flow chart of a method for manufacturing a mask plate according to an embodiment of the present disclosure.

An embodiment of the present disclosure further provides a method 1000 for manufacturing the above mask plate 2. Reference is made to FIG. 5. The method 1000 includes steps S1 and S2.

In step S1, a plurality of grooves 201 are formed in an array form and on a surface of the mask plate 2.

In step S2, an opening 202 is formed in the middle of each of the grooves 201, and the opening 202 corresponds to a display region of a display substrate.

Step S1 further includes forming the plurality of grooves 201 through a half-etching process.

Figure 4A:
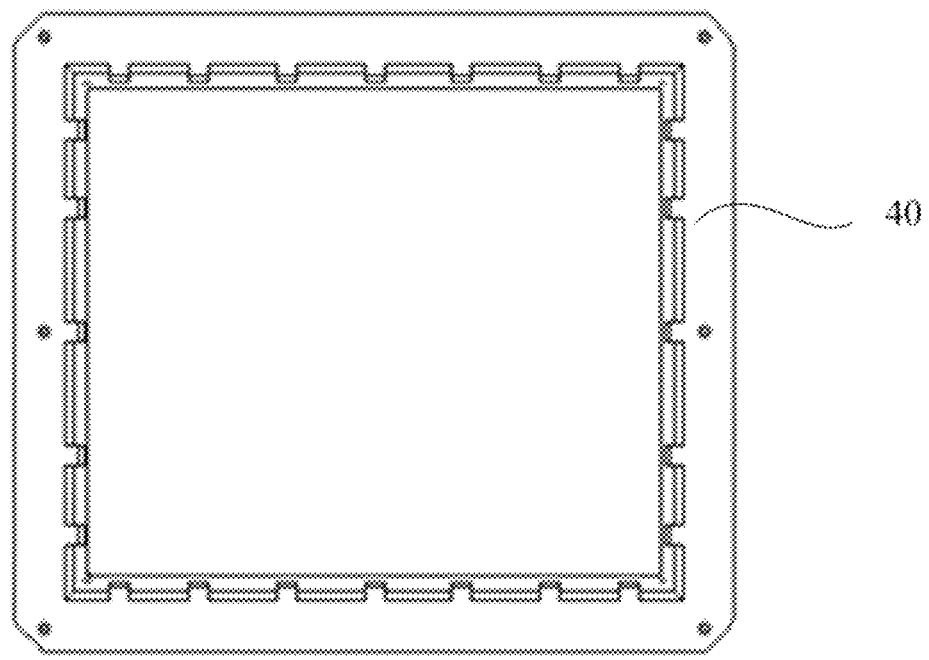
FIG. 4A is a schematic diagram of a frame of a mask plate assembly according to an embodiment of the present disclosure.

In addition, an embodiment of the present disclosure further provides a mask plate assembly 5, which may be used in evaporation. FIG. 4A is a schematic diagram of a frame 40 of the mask plate assembly 5 according to the embodiment of the present disclosure, and FIG. 4B is a schematic diagram of a mask plate of the mask plate assembly 5 after stretched according to the embodiment of the present disclosure.

Figure 4B:
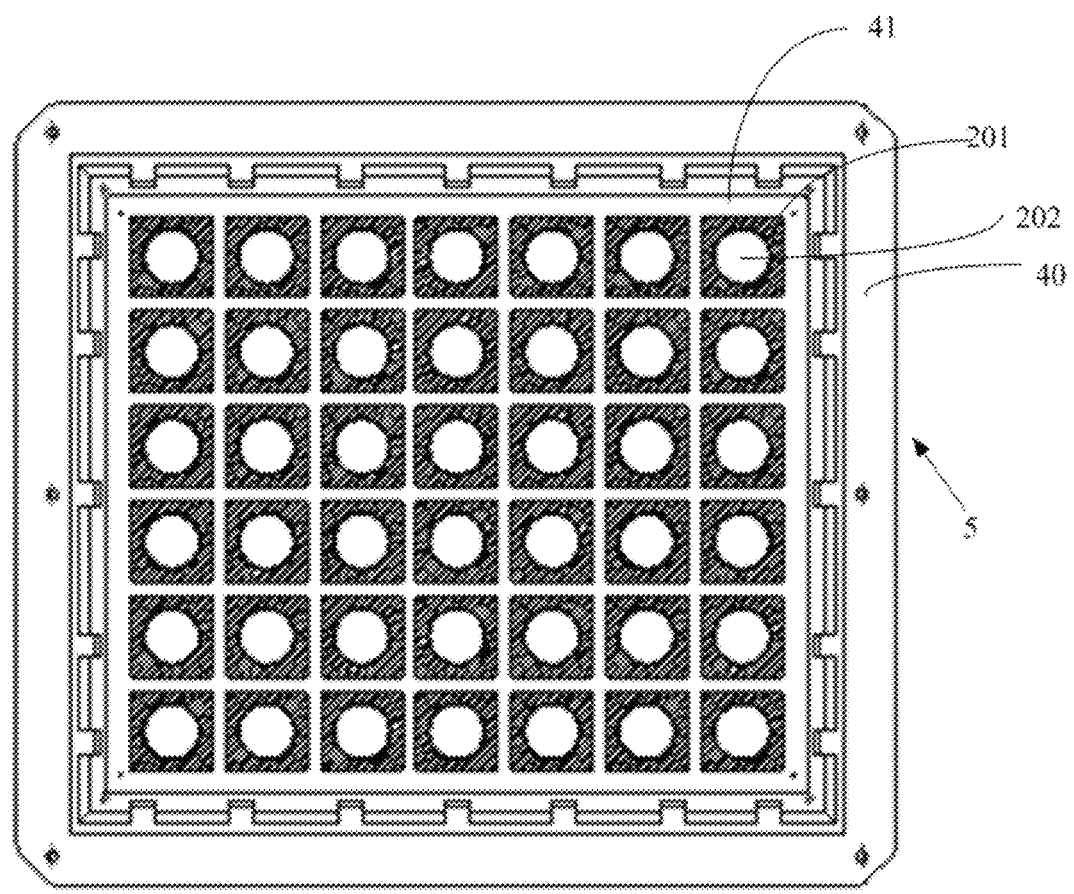
FIG. 4B is a schematic diagram of a mask plate of a mask plate assembly after stretched according to an embodiment of the present disclosure.

As shown in FIGS. 4A and 4B, the mask plate assembly 5 according to the embodiment of the present disclosure includes a frame 40, a first mask plate 41 may be welded onto the frame 40 and a second mask plate (not shown) may be welded onto the first mask plate 41. The first mask plate 41 is the mask plate according to the embodiment of the present disclosure, the second mask plate is a fine metal mask FMM, the second mask plate is stacked on the first mask plate 41, and a surface of the first mask plate 41 arranged with the grooves faces the second mask plate.

In the related art, during stretching, the fine metal mask FMM is directly welded onto the frame 40, while the fine metal mask FMM of the mask plate assembly 5 according to the embodiment of the present disclosure may be directly welded onto the first mask plate 41, but not directly welded to the frame 40.

When the display substrate 1 is evaporated to by using the mask plate assembly 5 according to the embodiment of the present disclosure, two mask plates are arranged, the first mask plate of which is the mask plate according to the embodiment of the present disclosure, used as an auxiliary mask plate and stacked below the fine metal mask FMM. The surface of the first mask plate arranged with the grooves faces the fine metal mask FMM, and the first mask plate is mainly configured to define a shape of the display region 101. A rectangle thinned region with the groove is arranged on the auxiliary mask plate, and a plurality of openings 202 corresponding to the display regions each having a special shape such as a circular shape of the display substrate 1 are arranged in the rectangle thinned region with the grooves to define the shape of each display region. Since the grooves have a regular rectangle shape, the non-uniform stress and wrinkle do not occur to the openings 202 with a special shape such as the circular shape when stretching the fine metal mask FMM, which enables the design of the fine metal mask FMM unaffected by the shape and size of the display region of the display substrate. In addition, a weight of the auxiliary mask plate may be decreased due to the thinned region with the grooves 201 to decrease gravity sagging phenomena, so that a sagging amount of the first mask plate is easily controlled within 150 microns, and a stretching tension and a deformation amount of the opening 202 may be decreased.

Figure 6:
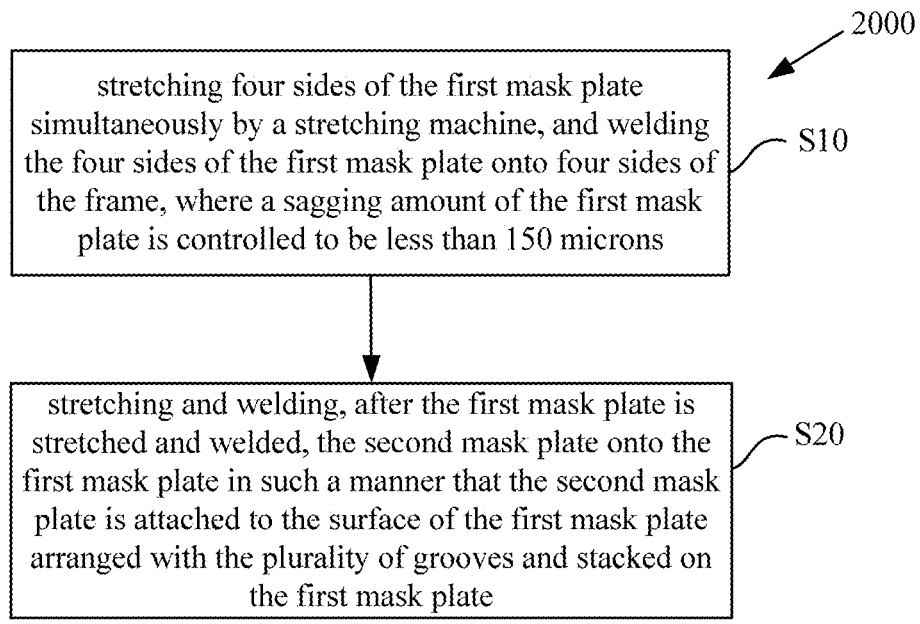
FIG. 6 is a flow chart of a method for manufacturing a mask plate assembly according to an embodiment of the present disclosure.

In addition, an embodiment of the present disclosure further provides a method 2000 for manufacturing the mask plate assembly 5. Reference is made to FIG. 6. The method 2000 includes steps S10 and S20.

In step S10, four sides of the first mask plate 41 are simultaneously stretched by a stretching machine and welded onto four sides of the frame 40, and a sagging amount of the first mask plate 41 is controlled to be less than 150 microns.

In step S20, after the first mask plate 41 is stretched and welded, a second mask plate is welded onto the first mask plate 41 in such a manner that the second mask plate is attached to the surface of the first mask plate 41 arranged with the plurality of grooves and stacked on the first mask plate 41.

The beneficial effects of the present disclosure are as follows. When evaporating to the display substrate, two mask plates may be arranged, one is a fine metal mask FMM, and the other is the mask plate according to the present disclosure, which is used as an auxiliary mask plate, and mainly configured to define a shape of the display region. Since the shape of the groove is regular (such as a rectangular shape), the non-uniform stress and wrinkle do not occur to the openings with a special shape such as a circular shape when stretching the fine metal mask FMM. The mask plate is stretched as a whole. Except a region corresponding to the display region arranged with the opening, the other regions may completely block the organic material and define the shape of the display region, which enables the design of the fine metal mask FMM unaffected by the shape and size of display region of the display substrate. In addition, a weight of the auxiliary mask plate may be decreased due to the thinned region with the grooves to decrease gravity sagging phenomena, The foregoing embodiments are only optional embodiments of the present disclosure. It should be noted that several improvements and substitutions can be made by persons skilled in the art without departing from the technical principle of the present disclosure, and those improvements and substitutions shall also fall within the protection scope of the present disclosure.

What is claimed is:

1. A mask plate, comprising:
    a plurality of grooves arranged in an array form and on a surface of the mask plate, wherein an opening is arranged in the middle of each of the grooves, and the opening corresponds to a display region of a display substrate;
    wherein the mask plate further comprises an alignment portion corresponding to each of the grooves, the alignment portion is an alignment hole arranged at each of four corners of each of the grooves;
    wherein the groove is of a rectangular shape, four corners of the groove are of notches to form four notch regions, and each of the alignment holes is arranged in each of the four notch regions of the groove.
2. The mask plate according to claim 1, wherein the groove is of a square shape.
3. The mask plate according to claim 1, wherein the opening is of an oval shape.
4. The mask plate according to claim 1, wherein the opening is of a circular shape, and a diameter of the opening is 100 to 300 microns larger than a diameter of the corresponding display region on the display substrate.
5. The mask plate according to claim 1, wherein a protrusion is formed around an outer peripheral edge of the opening.
6. The mask plate according to claim 5, wherein the protrusion has a width ranging from 1 millimeter to 1.5 millimeters.
7. The mask plate according to claim 1, wherein a depth of the groove is one-half of a thickness of the mask plate.
8. The mask plate according to claim 1, wherein a distance between two adjacent grooves is 1 to 2 millimeters.
9. A mask plate assembly, comprising:
    a first mask plate that is the mask plate according claim 1; and
    a second mask plate stacked on the first mask plate, wherein the surface of the first mask plate arranged with the plurality of grooves faces the second mask plate.
10. The mask plate assembly according to claim 9, further comprising a frame, wherein the first mask plate is welded onto the frame, and the second mask plate is welded onto the first mask plate.
11. A method for manufacturing the mask plate assembly according to claim 10, comprising:
    stretching four sides of the first mask plate simultaneously by a stretching machine, and welding the four sides of the first mask plate onto four sides of the frame; and
    stretching and welding, after the first mask plate is stretched and welded, the second mask plate onto the first mask plate in such a manner that the second mask plate is attached to the surface of the first mask plate arranged with the plurality of grooves and stacked on the first mask plate.
12. The method according to claim 11, further comprising:
    controlling a sagging amount of the first mask plate to be less than 150 microns, in the case of stretching four sides of the first mask plate simultaneously by the stretching machine and welding the four sides of the first mask plate onto four sides of the frame.
13. A method for manufacturing the mask plate according to claim 1, comprising:
    forming a plurality of grooves in an array form and on a surface of the mask plate; and
    forming an opening in the middle of each of the grooves, wherein the opening corresponds to a display region of a display substrate.
14. The method according to claim 13, wherein the forming the plurality of grooves in an array form and on the surface of the mask plate comprises: forming the plurality of grooves through a half-etching process.
15. The mask plate according to claim 1, wherein a protrusion is formed around an outer peripheral edge of the opening.
16. The mask plate according to claim 1, wherein a depth of the groove is one-half of a thickness of the mask plate.

* * * * *